United States Patent [19]

Steingroever et al.

[11] Patent Number: 4,625,166
[45] Date of Patent: Nov. 25, 1986

[54] METHOD FOR MEASURING MAGNETIC POTENTIALS USING HALL PROBES

[76] Inventors: Dietrich Steingroever, 5060 Berg.-Gladbach 1; Erich Steingroever, Flensburger Str. 33, 5300 Bonn 1, both of Fed. Rep. of Germany

[21] Appl. No.: 581,079

[22] Filed: Feb. 17, 1984

[30] Foreign Application Priority Data

Feb. 19, 1983 [DE] Fed. Rep. of Germany ....... 3305888

[51] Int. Cl.$^4$ ..................... G01R 33/14; G01R 33/06; G01R 19/08
[52] U.S. Cl. ............................... 324/223; 324/117 H; 324/235; 324/251
[58] Field of Search .................... 324/117 H, 235, 243, 324/251, 222, 223

[56] References Cited

U.S. PATENT DOCUMENTS

| | | | |
|---|---|---|---|
| 3,365,660 | 1/1968 | Steingroever | 324/223 X |
| 3,925,724 | 12/1975 | Steingroever | 324/243 |
| 4,087,749 | 5/1978 | McCormack | 324/235 X |

FOREIGN PATENT DOCUMENTS

| | | | |
|---|---|---|---|
| 1257959 | 1/1968 | Fed. Rep. of Germany | 324/251 |
| 0115174 | 9/1979 | Japan | 324/117 H |

OTHER PUBLICATIONS

Zijlstra, H., "Experimental Methods in Magnetism" North-Holland Publishing Company–Amsterdam, ch. 1, sec. 11, pp. 56-59.

Primary Examiner—Gerard R. Strecker
Attorney, Agent, or Firm—Harold Gell

[57] ABSTRACT

The present invention concerns devices with probes for measuring magnetic potentials. Potential differences between two points of a material in a magnetic field are measured with a plurality of Hall probes arranged on a curved line which connects the points. The voltage of each Hall probe is connected with the summation point of an operational amplifier whose output voltage is proportional to the potential difference $P=\int H \cdot ds$. A similar arrangement may also be used to measure the current in a conductor.

5 Claims, 6 Drawing Figures

4,625,166

METHOD FOR MEASURING MAGNETIC POTENTIALS USING HALL PROBES

BACKGROUND OF THE INVENTION

The present invention concerns devices with probes for measuring magnetic potentials.

The magnetic potential, $\psi$, is defined by $$H = -\text{degree } \psi,$$

i.e., the magnetic field intensity is the gradient of the magnetic potential field. In principle, only differences of the magnetic potential between two points in a magnetic field can be measured by determining the path integral.

$$\int_0^1 H \cdot ds$$

between the points 0 and 1. Here, H is the magnetic field intensity and ds is a path element on any arbitrary line between the points 0 and 1.

When considering the potential difference between a point 1 of a magnetic field and another point 0 located outside the magnetic field, the integral can be described as magnetic potential of the point 1.

It is known that magnetic potentials can be measured with a magnetic fluxmeter and long, thin coils with constant surface density of turns (A. P. Chattock, "Phil. Mag.", 24, 94, 1887). If one end of such a potential coil is moved in a magnetic field from one point to another, while the other end is immobile or is moving in field-free space, an electrical voltage U is generated in it, whose time integral $\int U \, dt$ is measured and indicated by the connected fluxmeter. This [integral] is proportional to the path integral $\int H \cdot ds$:

$$\int_a^b H \cdot ds = \frac{1}{\mu_0} \cdot \frac{1}{n \cdot A} \int_{t_0}^{t_1} U \cdot dt$$

$$- 8$$

in which $\mu_0 = 0.4\pi \cdot 10^{-8}$ Vsec/A cm, l=length of the measuring coil, n=number of turns, A=area of one turn, $t_0$=time at the beginning, $t_1$=time at the end of the measurement.

Substantial disadvantages of this prior-art measuring device are, on the one hand, the low sensitivity, when measuring coils with small turn area A are used for better field resolution, and, on the other hand, the drift which is always present in a fluxmeter, which causes an error in measurement especially in the case of prolonged measurements, e.g., during the plotting of the hysteresis curves of magnetic materials. These disadvantages are eliminated by the present invention.

SUMMARY OF THE INVENTION

It is characterized in that the path integral $\int H \cdot ds$ is measured between two points, 0 and 1, of magnetic field with several Hall probes arranged along a line which connects the points 0 and 1 between which the magnetic potential difference is to be measured.

The Hall probes are preferably arranged at an equal distance from one another and in such a way that they measure the magnetic field intensity in the direction of the line on which they lie.

DETAILED DESCRIPTION OF THE INVENTION

Figure 2:
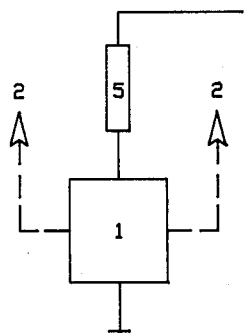
FIG. 2 is a schematic diagram of the connection of a control current to each of the probes.

The principle of measurement and examples of embodiments of the present invention are shown in the drawings.

Figure 1:
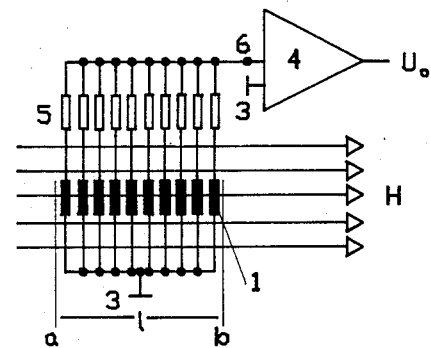
FIG. 1 is a schematic diagram of an arrangement of Hall probes in a magnetic field wherein each probe yields a voltage proportional to H.

FIG. 1 shows a number of Hall probes 1 (only the first one of which is marked by the reference number), which are arranged spaced at equal distances from one another in the magnetic field H in such a way that each yields a Hall voltage proportional to the field H. They are shown only schematically, the connections for the control current being omitted (A Hall probe 1 with the connections 2 for the control current is shown in FIG. 2). The Hall probes in FIGS. 1 and 2 are all connected with a common conductor 3 to an operational amplifier 4, on the one hand, and the Hall voltage of each probe is sent via a resistor 5 of its own to the summation point 6 of the operational amplifier 4, on the other hand. The operational amplifier 4 shows on the output a voltage $U_0$ which is proportional to the potential difference P between the points a and b of the field:

$$U_0 \approx P = \int_a^b H \cdot ds = H \cdot l$$

in which l=length of the line ab on which the Hall probes are arranged. The resistors 5 and/or the control currents of the Hall probes are always selected or individually adjusted in such a way that the same sensitivity is achieved for all Hall probes.

Figure 3:
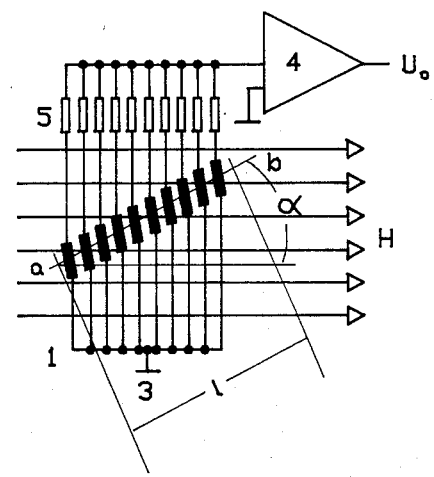
FIG. 3 is similar to FIG. 1, except that the probes are arranged at an angle with respect to the magnetic field.

FIG. 3 shows a likewise linear arrangement of Hall probes which are arranged at an angle $\alpha$ to the field direction. The value indicated by the fluxmeter will be accordingly:

$$U_0 \approx P = \int_a^b H \cdot ds = H \cdot l \cdot \cos \alpha$$

The advantage of the present invention lies in the fact that the new measuring device for magnetic potential differences has no drift, so that measurements or measurement series of any length can be carried out with it.

Another advantage is that the magnetic potentials or potential differences are carried out statically, i.e., without the flux change which is necessary in the case of measurement with potential coil and fluxmeter by moving the coil or by switching on or off or reversing the field.

Figure 4:
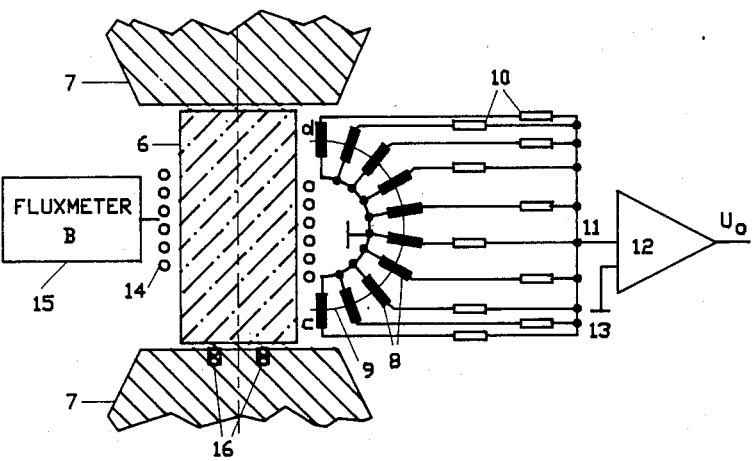
FIG. 4 illustrates a specific arrangement of Hall probes for measurement of the hysteresis curve of a permanent magnet.

One application example of the present invention is shown in FIG. 4, specifically the measurement of the hysteresis curve B(H) of a permanent magnet. Here, 6 is the magnet whose hysteresis curve is measured; 7 is the poles N and S of an electromagnet for generating the field H in the magnet 6; 8 is the Hall probes arranged on a semicircular line 9, which are connected with the summation point 11 of the preamplifier 12 via the resistors 10, on the one hand, and are connected together with its common connection 13, on the other hand. The voltage $V_0$, which is proportional to the path integral $\int H \cdot ds$, is generated on the output of the preamplifier. Since the magnetic field intensity Hm within a magnet is known to be equal to that on the surface of the magnet, $$H_m = \frac{1}{l} \cdot P = \frac{1}{l} \cdot \int_c^d H \cdot ds$$

is obtained, in which l is the distance between the two points, c and d.

The values of the flux density B, which belong to the actual values of the magnetic field intensity H in the magnet, are detected in the known manner with a coil 14 which surrounds the magnet and closely adjoins it, which said coil is connected to a fluxmeter 15. However, it (the flux density) can also be measured in an advantageous manner with a Steingroever exciter coil 16 recessed in the pole 7 of the electromagnet as described in Journ. Appl. Phys., Vol. 37, No. 3, pp. 1116–1117, 1966, and in U.S. Pat. No. 3,925,724.

Figure 5:
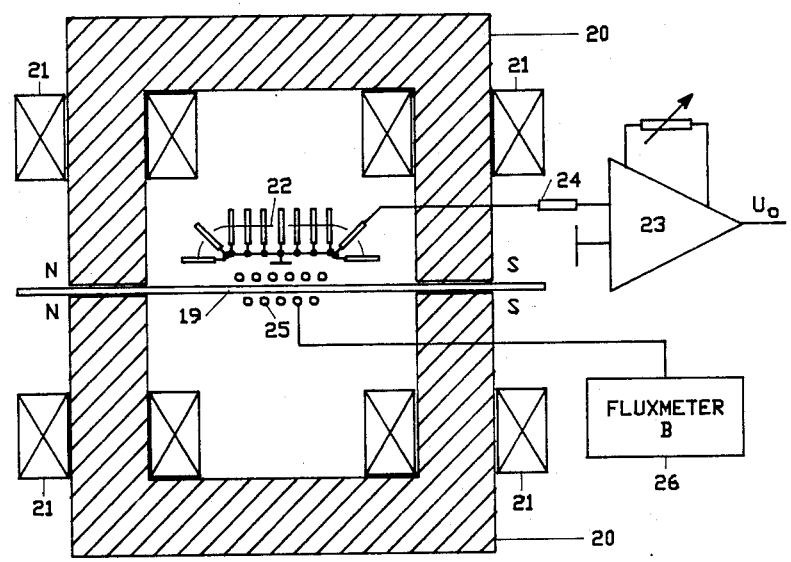
FIG. 5 shows another specific arrangement of Hall probes for the measurement of the hysteresis curve of a soft magnetic material.

The corresponding assembly for measuring the hysteresis curve of soft magnetic materials is shown in FIG. 5. Here, 19 is the sample to be measured, e.g., in the form of a plate or bar, which is clamped between two U-shaped yokes 20 made of soft iron. The magnetic field H is generated by four coils 21 in which a controlled field current flows, which excites, for example, the sample 19 with the polarities N and S, or vice versa.

The magnetic field intensity H in the sample is measured in the above-described manner with the Hall probes arranged on the curved line 22 drawn in broken line, which Hall probes are connected to an amplifier 23. The resistors belonging to the individual Hall probes in the conductors leading to the amplifier 23 are indicated in the drawing by the resistor 24 in the one conductor shown. Less space is needed for the probe in this approximately single-phase arrangement of the Hall probes.

The voltage $U_0$ at the output of the amplifier 23 is proportional to the magnetic field intensity H in the sample 19:

$$H \approx \frac{1}{l} \cdot P = \frac{1}{l} \cdot \int_c^d H \cdot ds$$

The flux density B in the sample is measured in the known manner with a coil 25 closely surrounding it and with a fluxmeter 26.

Figure 6:
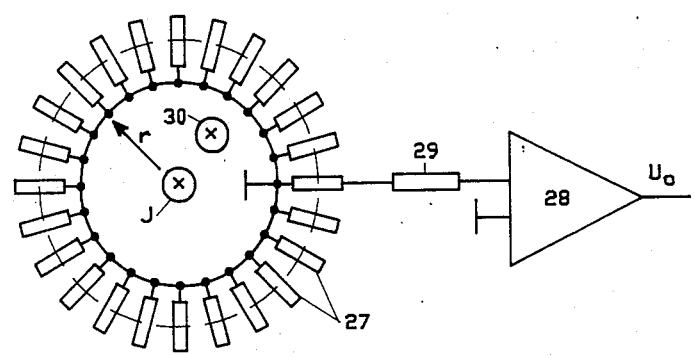
FIG. 6 illustrates a circular arrangement of Hall probes in accordance with the invention for measurement of the current flowing in a conductor.

Another application of the present invention is shown in FIG. 6. Here, Hall probes 27 at equal distances from one another are arranged on a circular line and connected in the above-described manner with the amplifier 28 via the resistors 29 of which only one is shown here again. The Hall probes surround the current conductor J. The sum of their Hall voltages $U_0$ is indicated on the output of the amplifier 28 in proportion to the current intensity J:

$$U_0 \approx P = \int H \cdot ds = 2r\pi \cdot J \text{ or } J \approx U_0$$

in which r is the radius of the circular line on which the Hall probes are arranged.

The advantage of this application of the present invention lies in the fact that the current conductor J can assume any position within the measuring circuit, e.g., it can be located even at 30, on the one hand, and it is possible to measure any current and/or rapid current pulse or high-frequency currents, on the other hand. This is not possible in prior-art "clamp-on probes" with only one Hall probe in the air gap of an iron path surrounding the current conductor because of the magnetic saturation of the iron path at high current intensities and because of the eddy currents generated in the iron during rapid pulses or at high frequencies of the current to be measured.

We claim:

1. Method of measuring the hysteresis curve of a magnetic material, including the steps of:
    subjecting the material to a magnetic field;
    obtaining the summation voltage of a plurality of Hall probes spaced from each other in an exclusively non-magnetic arcuate path with the respective endmost probes located adjacent two spaced points on said material to provide a value that is proportional to the magnetic field intensity within said material;
    obtaining the value of the magnetic flux density in the material; and
    deriving a hysteresis curve of said material from obtained magnetic flux density and magnetic field intensity values.

2. Method defined by claim 1, wherein the value that is proportional to the magnetic field intensity within said material is the magnetic potential sensed by the Hall probes disposed at the respective opposite ends of said arcuate path.

3. Method defined by either one of claims 1 or 2, wherein the Hall probes are spaced from each other at equal distances along said arcuate path.

4. Method defined by claim 1, which includes the use of electrical amplifier means wherein the individual outputs of each of the Hall probes are connected to the summation point of said amplifier means.

5. Method defined by claim 4, wherein each of the Hall probes includes means for individually adjusting a control current for said probe.

* * * * *